United States Patent [19]

Krechmer et al.

[11] Patent Number: 4,625,259

[45] Date of Patent: Nov. 25, 1986

[54] INTEGRAL PIVOTING POWER SUPPLY

[75] Inventors: Kenneth R. Krechmer; James C. Milroy; William R. Burnett; Thomas A. Howell, all of Palo Alto, Calif.

[73] Assignee: Prentice Corporation, Sunnyvale, Calif.

[21] Appl. No.: 599,570

[22] Filed: Apr. 12, 1984

[51] Int. Cl.$^4$ ............................................. H02B 1/04
[52] U.S. Cl. .................................. 361/340; 339/5 L; 361/334; 361/395
[58] Field of Search ............... 174/54, 56; 307/9, 150; 339/5 L, 6 A, 6 R, 7, 8 R, 8 PS, 8 RL, 34, 195 A, 196 A; 361/340, 391, 395

[56] References Cited

U.S. PATENT DOCUMENTS

| | | | |
|---|---|---|---|
| 2,130,250 | 9/1938 | Reed | 361/340 |
| 2,185,562 | 1/1940 | Nielsen | 361/391 |
| 3,135,821 | 6/1964 | Lanham | 339/34 |

Primary Examiner—G. P. Tolin
Assistant Examiner—Greg Thompson
Attorney, Agent, or Firm—Kirkland & Ellis

[57] ABSTRACT

The subject invention relates to an integrated electronic assembly comprising a power supply and as associated electronics unit powered thereby. The integral power supply housing is pivotal with respect to the electronics unit housing. Protruding from the power supply is a plug (pair of prongs) for insertion directly into a standard electrical outlet to permit the entire assembly to be physically supported thereby. A detent is provided for holding the power supply at predetermined orientations with respect to the electronics unit. Electrical connections are maintained between the power supply and the electronics unit while they are pivoted at various orientations with respect to each other.

8 Claims, 7 Drawing Figures

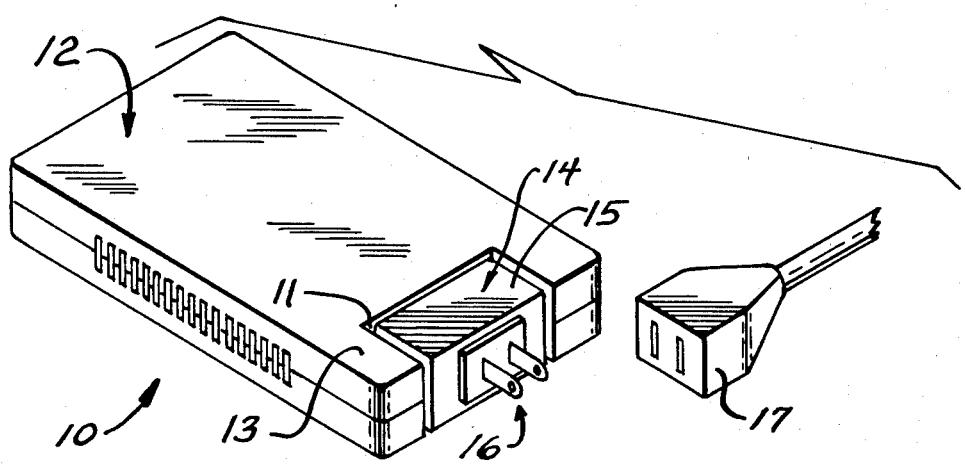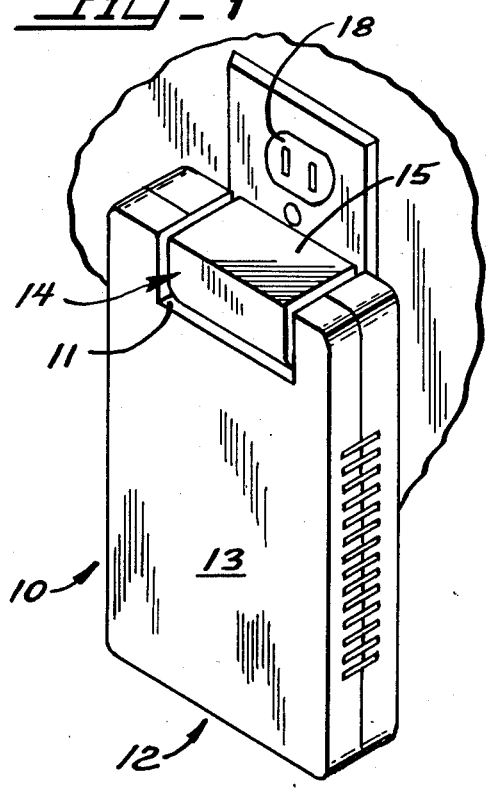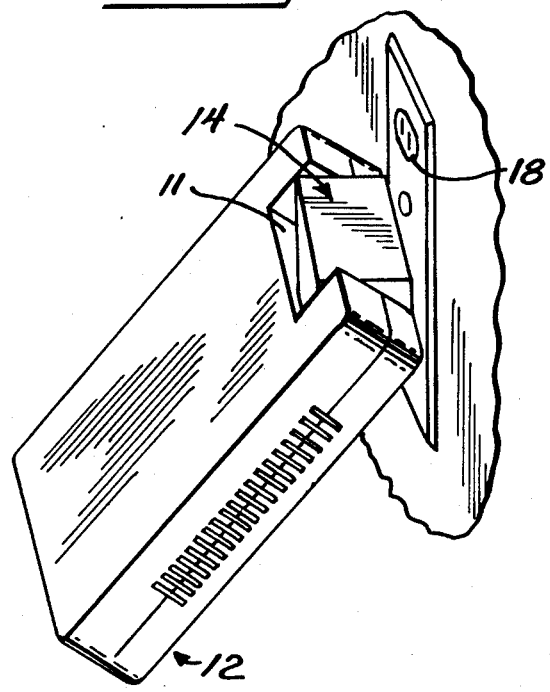

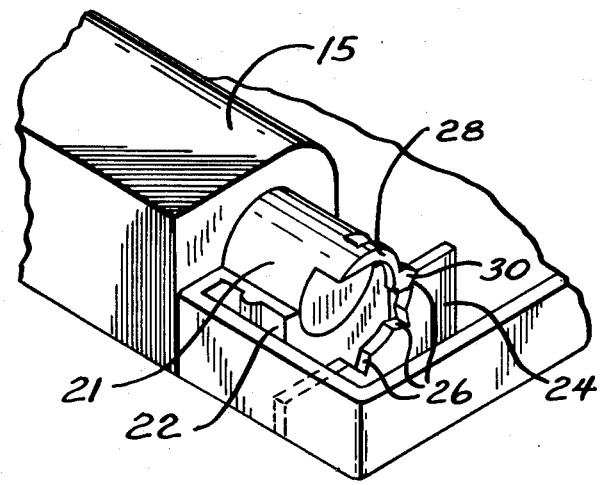
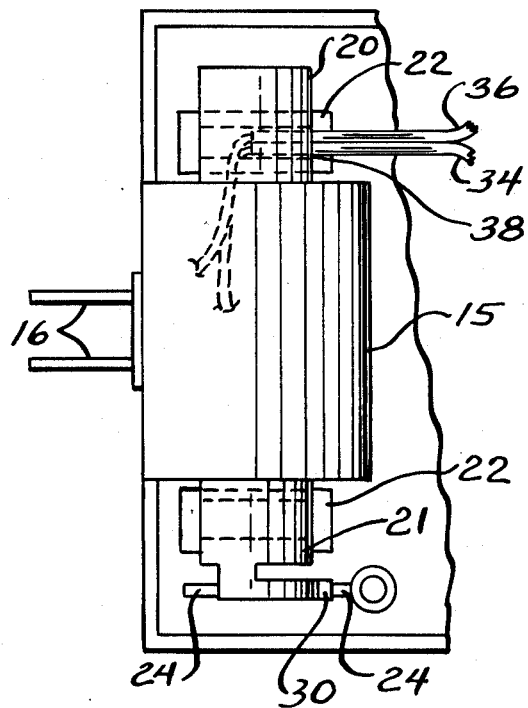
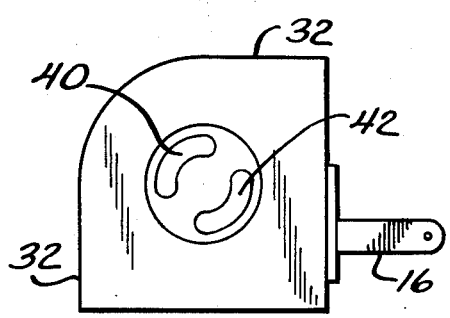
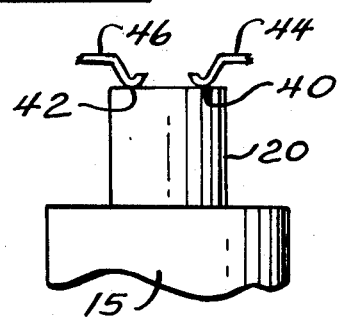

INTEGRAL PIVOTING POWER SUPPLY

BACKGROUND OF THE INVENTION

1. Field of the Invention

The subject invention relates generally to an integrated device comprising an electronic device and an associated power supply adapted for being plugged into a standard AC current electrical outlet, the power supply being pivotal with respect to the associated electronic device.

2. Background Art

A wide variety of electronic devices require a power supply to convert standard 60 hertz AC electrical current to DC current to power the device. Many of these electronic devices are separately housed and remotely located from the power supply used to power them. Typically, the power supply has an electrical plug capable of being inserted into a standard AC electrical outlet in a wall or an extension cord. In addition, the power supply has a pair of conductors to carry the DC current to the electronic device being powered thereby. The electrical plug may be an integral part of the power supply or it may be connected to the power supply by a standard AC line cord.

In many applications, the separate power supply, AC line cord, DC conductors and the electronic device being powered create undesirable clutter and frequently require that the electronic device occupy desk space. Moreover, relocation of the electronic device requires moving the various wires and separate assemblies. Constructing the power supply and electronic device in a single housing with an external AC line cord afforded a partial solution. However, for small electronic devices it is desirable for the device itself to have an integral electrical plug capable of being inserted directly into a standard electrical outlet without the use of an AC line cord. However, such integral electrical plugs undesirably restrict the orientation of the electronic device with respect to the electrical outlet. The prior art offers no method for satisfactorily dealing with these problems.

SUMMARY OF THE INVENTION

In order to overcome these difficulties, the present invention provides a unitary housing for both the power supply and the electronic device. Protruding from the power supply is a two-pronged electrical plug for insertion directly into a standard electrical outlet to permit the unitary assembly to be physically supported thereby. The power supply of the present invention is pivotable with respect to the rest of the integral unit. In one embodiment, the pivotable mount permits the power supply (and hence also the electrical plug) to be pivoted up to ninety degrees with respect to the electronic device. Detent stop means are provided for holding the power supply at predetermined orientations with respect to the electronic device, for example, pivoted at 0°, 45° and 90°. Accordingly, the power supply may be oriented with respect to the electronic device so as to be positioned, when inserted into an electrical outlet in a wall, in a plane parallel to the wall or inclined at some angle with respect to the wall. In addition, the power supply may be pivoted so that the two-pronged electrical plug is parallel with the major axis of the electronic device to accommodate desk-top operation.

BRIEF DESCRIPTION OF THE DRAWING

FIG. 1 is a perspective view of the preferred embodiment of the present invention with the electrical plug of the integral power supply plugged into an electrical outlet;

FIG. 2 is a perspective view of the preferred embodiment of the present invention;

FIG. 3 is a perspective view of the preferred embodiment of the present invention with the electrical plug of the integral power supply pivoted at an angle with respect to the positions illustrated in FIGS. 1 and 2;

FIG. 4 is a side view with parts removed showing the detent means of the preferred embodiment of the present invention;

FIG. 5 is a top view with parts removed of the preferred embodiment of the present invention;

FIG. 6 is a side view showing the sliding contacts of an alternative embodiment of the present invention; and FIG. 7 is a top view with parts removed of the alternative embodiment of FIG. 6.

DETAILED DESCRIPTION OF THE PREFERRED EMBODIMENT

With reference to FIGS. 1, 2 and 3, the integral unit 10 comprises an electronics unit 12 within a housing 13 and an integral power supply 14 within a separate housing 15. In the preferred embodiment, the housing 13 contains a cavity or recess 11 configured to accept the housing 15. Power supply 14 includes a two-pronged electrical plug 16 that protrudes from, and is integral with, the housing 15 for insertion into a standard AC current electrical outlet 18 (FIGS. 1 and 3) or extension cord 17 (FIG. 1). In one embodiment, electronics unit 12 consists of a modem for providing data communications over a telephone network. The electrical construction of integral power supply 14 can have any suitable conventional design employing a transformer, rectifier means and associated circuitry (not shown) for converting the AC current supplied from standard electrical outlets into DC current of a voltage suitable for powering electronics unit 12.

As shown in FIGS. 4 and 5, pivot members or hinge members 20 and 21 are affixed to or are extensions of housing 15 for power supply 14. Pivot members 20 and 21 are rotatably retained within the housing 13 by means of a pair of brackets 22, which at least partially surround pivot members 20 and 21. The brackets 22 are affixed to the housing 13 so as to securely hold power supply 14 within the housing 13. As illustrated in FIG. 2, the power supply 14 can be pivoted so that the electrical plug 16 is parallel with the major axis of the electronics unit 12 to facilitate desk-top operation. The power supply 14 can also be pivoted to other orientations with respect to the electronics unit 12, as shown in FIGS. 1 and 3, for example.

In the preferred embodiment, a retainer 24 also is rigidly affixed to housing 13 of the electronics unit 12. The retainer 24 includes detents 26 spaced around its inner periphery. One end of a stop member 28 is rigidly attached to pivot member 21. In the preferred embodiment, the stop member 28 is made of a flexible, plastic or other suitable material that tends to spring back to its normal position when flexed. The other end of the stop member 28 has a convex member 30 configured to engage any of the detents 26, depending upon the pivotal orientation of power supply housing 15 with respect to the housing 13 of the electronics unit 12. Stop member 28 is mounted with respect to the inner periphery of retainer 24 so as to slightly compress the stop member 28, thereby biasing the convex member 30 against the inner periphery of retainer 24 and the detents 26 therein. Other suitable means for biasing a convex member into detent means also could be used with the present invention. Thus, when member 30 engages a detent 26, the power supply 14 is held from pivoting about pivot members 20 and 21 within brackets 22. Applying sufficient torque, however, about the axis of pivot members 20 and 21 causes the stop member 28 to overcome the bias being applied and flex out of its detent 26, thus permitting pivot members 20 and 21, and consequently power supply 14, to pivot about their common axis with respect to the housing 13.

If desired, limit stops (not shown) can be provided on the inner periphery of retainer 24 to prevent the power supply 14 from pivoting beyond a predetermined range of orientations with respect to the housing 13. Alternatively, the housing 15 and housing 13 can be configured so as to limit the range within which the housing 15 can pivot with respect to the housing 13. In the embodiment shown in FIGS. 1, 2 and 6, the housing 15 can pivot only 90° with respect to the housing 13 due to the surfaces 32 abutting against the interior surfaces of cavity 11.

DC power is obtained from the power supply 14 to power the electronics unit 12 via leads 34 and 36. Leads 34 and 36 pass through a slot 38 in the pivot member 20. In an alternative embodiment, sliding electrical contacts 40 and 42 (FIGS. 6 and 7) are used instead of wire leads 34 and 36 to conduct DC power from power supply 14 to electronics unit 12 via contacts 44 and 46, respectively.

While the preferred embodiment of the invention has been illustrated and described, it is to be understood that the invention is not limited to the precise construction herein disclosed, and the right is reserved to all changes and modifications coming within the scope of the invention as defined in the appended claims.

We claim:

1. A housing assembly, comprising
   a power supply;
   a first housing holding said power supply;
   pivot means affixed to said first housing for pivoting with said first housing;
   an electronics unit powered by said power supply;
   a second housing holding said electronics unit, said second housing having a cavity configured to permit said first housing to pivot within said cavity in said second housing; and
   electrical connector means for providing an electrical connection between said power supply and said electronics unit while said first housing is pivoted within said cavity in said second housing.

2. The housing assembly as claimed in claim 1 further comprising:
   detent means for opposing the pivoting of said pivot means away from a predetermined orientation between said first housing and said second housing.

3. The housing assembly as claimed in claim 1 wherein said electrical connector means further comprises at least one wire flexibly connected between said power supply and said electronics unit.

4. The housing as claimed in claim 1 wherein said electrical connector means further comprises at least one pair of sliding contacts that remain in physical engagement with each other while said first housing pivots with respect to said second housing, one of said sliding contacts being affixed to said first housing and the other of said sliding contacts being affixed to said second housing.

5. A housing assembly which contains a power supply and an electronics unit powered thereby, comprising
   a first housing holding said power supply;
   pivot means affixed to said first housing pivoting with said first housing;
   a second housing holding said electronics unit, said second housing having a cavity configured to permit said first housing to pivot within said cavity in said second housing;
   electrical connector means for providing an electrical connection between said power supply and said electronics unit while said first housing is pivoted within said cavity in said second housing;
   a retaining member affixed to said second housing, said retaining member having a detent therein;
   a flexible stop member affixed to said pivot means of said first housing, said flexible stop member having a convex portion engageable with said detent in said retaining member; and
   biasing said convex portion of said stop member toward said retaining member so as to oppose relative rotation between said stop member and said retaining member while said convex portion and said detent are engaged, relative rotation between said stop member and said retaining member occurring when sufficient torque is applied between said retaining member and said stop member to overcome the bias applied to said convex portion.

6. The housing assembly as claimed in claim 2 or 3 wherein said first housing further comprises a two-pronged electrical plug affixed thereto and engageable with an electrical outlet, said housing assembly being physically supportable by said electrical plug when it is engaged in an electrical outlet.

7. An assembly comprising:
   a power supply;
   a first housing which contains said power supply;
   an electronics unit powered by said power supply;
   a second housing which contains said electronics unit;
   hinge means having first and second hinge members pivotable about an axis, said first hinge member being affixed to said first housing and said second hinge member being affixed to said second housing so as to permit said first housing to pivot with respect to said second housing; and
   electrical connector means for providing an electrical connection between said power supply and said electronics unit while said first housing is pivoted with respect to said second housing.

8. An adjustable housing assembly comprising:
   power supply means having an external electrical plug from which said power supply means derives power when said external electrical plug is inserted into a live electrical outlet;
   a first housing containing said power supply means, said electrical plug being fixedly mounted on a first exterior surface of said first housing;
   pivot means having a first end fixedly mounted to a second exterior surface of said first housing, said first and second exterior surfaces being substantially perpendicular to each other, said pivot means also having a second end;

an electronics unit;

a second housing containing said electronics unit, said second housing having a cavity configured to permit said first housing to be pivotably mounted therein;

bracket means affixed to said second housing receiving said second end of said pivot means, said bracket means pivotably retaining said pivot means therein so as to permit said first housing to pivot within said cavity in said second housing; and electrical connector means for providing an electrical connection between said power supply means in said first housing and said electronics unit in said second housing while said first housing is pivoted within said cavity in said second housing, whereby the position of said first housing with respect to said second housing can be adjusted to facilitate insertion of said electrical plug into an electrical outlet.

* * * * *